(12) United States Patent
Bohne et al.

(10) Patent No.: US 10,809,291 B2
(45) Date of Patent: Oct. 20, 2020

(54) METHOD FOR DETECTING A PROPER CONNECTION OF AT LEAST ONE ENERGY STORE TO AN ON-BOARD ELECTRICAL SYSTEM

(71) Applicant: Robert Bosch GmbH, Stuttgart (DE)

(72) Inventors: Christian Bohne, Stuttgart (DE); Juergen Motz, Steinheim an der Murr (DE); Matthias Horn, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 70 days.

(21) Appl. No.: 15/565,190

(22) PCT Filed: Feb. 29, 2016

(86) PCT No.: PCT/EP2016/054224
§ 371 (c)(1),
(2) Date: Oct. 9, 2017

(87) PCT Pub. No.: WO2016/177488
PCT Pub. Date: Nov. 10, 2016

(65) Prior Publication Data
US 2018/0067157 A1    Mar. 8, 2018

(30) Foreign Application Priority Data

May 4, 2015    (DE) .................. 10 2015 208 207

(51) Int. Cl.
*G01R 31/02*    (2006.01)
*G01R 31/04*    (2006.01)
(Continued)

(52) U.S. Cl.
CPC ..... *G01R 31/006* (2013.01); *G01R 19/16542* (2013.01); *G01R 31/50* (2020.01); *G01R 31/66* (2020.01)

(58) Field of Classification Search
CPC ................. G01R 31/006; G01R 19/16542
See application file for complete search history.

(56) References Cited

U.S. PATENT DOCUMENTS

| | | | | |
|---|---|---|---|---|
| 6,246,216 B1 * | 6/2001 | Satake | ............ | G01R 19/16542 320/137 |
| 6,469,475 B2 * | 10/2002 | Pawlik | ................. | G01R 31/385 320/134 |
| 7,180,272 B2 * | 2/2007 | Okahara | ............... | H02J 7/1461 320/123 |

FOREIGN PATENT DOCUMENTS

| | | |
|---|---|---|
| CN | 103165951 A | 6/2013 |
| CN | 103825252 A | 5/2014 |

(Continued)

OTHER PUBLICATIONS

DE102004004172A1 (2005) English Machine Translation, Google Patents, retrieved Dec. 20, 2019.*

(Continued)

*Primary Examiner* — Minh Q Phan
(74) *Attorney, Agent, or Firm* — Norton Rose Fulbright US LLP; Gerard Messina

(57) ABSTRACT

A method for detecting correct connection of at least one energy reservoir to a vehicle electrical system of a motor vehicle. The method includes: ascertaining a voltage dropping at the energy reservoir, and/or a current flowing through the energy reservoir, and/or a voltage present at a terminal as a representative of the electrical system voltage, when the electrical system voltage exceeds or falls below at least one desired voltage, preferably as a function of at least one magnitude characteristic of the energy reservoir, such as an open-circuit voltage or gassing voltage; comparing the ascertained magnitude, such as the voltage and/or current, with at least one limit value; correct connection of the (Continued)

energy reservoir to the vehicle electrical system, or at least one fault, is inferred as a function of the comparison.

13 Claims, 2 Drawing Sheets

(51) Int. Cl.
    *G01R 19/165* (2006.01)
    *G01R 31/00* (2006.01)
    *G01R 31/50* (2020.01)
    *G01R 31/66* (2020.01)

(56) References Cited

FOREIGN PATENT DOCUMENTS

| | | |
|---|---|---|
| DE | 102004004172 A1 | 8/2005 |
| DE | 102004035513 A1 | 2/2006 |
| DE | 102004004173 B4 | 2/2014 |
| EP | 1093205 A2 | 4/2001 |
| EP | 1361448 A1 | 11/2003 |
| FR | 2963678 A1 | 2/2012 |
| WO | 2004042411 A1 | 5/2004 |

OTHER PUBLICATIONS

International Search Report dated Jun. 17, 2016, of the corresponding International Application PCT/EP2016/054224 filed Feb. 29, 2016.

* cited by examiner

METHOD FOR DETECTING A PROPER CONNECTION OF AT LEAST ONE ENERGY STORE TO AN ON-BOARD ELECTRICAL SYSTEM

BACKGROUND INFORMATION

The present invention relates to a method for detecting correct connection of at least one energy reservoir to a vehicle electrical system. An apparatus is described in German Patent Application No. DE 10 2004 035 513 A1, in which the battery current and generator current are ascertained substantially synchronously in time. Upon a change in the generator current, the at least one energy reservoir is investigated during a transition time as to the value of the battery current, in order to detect a compensating effect in the form of a current delivery or current draw.

German Patent Application No. DE 10 2004 004 173 B4 describes a method for recognizing a disconnected battery. Whether the battery is disconnected or defective, or whether a cable break exists, is recognized here from predefinable characteristics of the frequency.

SUMMARY

An object of the present invention is to recognize even more fault situations reliably without a great deal of extra outlay.

An example method according to the present invention may have an advantage that only hardware present in any case, to which control is applied in suitable fashion, is utilized. Provided for this purpose according to the present invention is a sensor, in particular an electrical battery sensor, that detects, in a conventional manner, characteristic parameters of an energy reservoir, preferably a battery. These are the battery voltage, the battery current, and the like. Further characteristic parameters of the energy reservoir, such as the state of charge (SOC), state of health, or the like can additionally be ascertained. According to the present invention, voltage adaptation means such as a DC voltage converter and/or generator have control applied to them in such a way that the electrical system voltage changes in a specific manner. The electrical system voltage is thus, for example, intended to fall below a specific lower limit voltage value that is defined, for example, by the open-circuit voltage of the energy reservoir. Or the electrical system voltage is deliberately raised above an upper limit voltage value that is defined, for example, by the gassing voltage of the energy reservoir, for example a lead-acid battery. In these two different operating states, it is possible to ascertain characteristic magnitudes of the energy reservoir such as current and/or voltage, which can provide sufficient information regarding a wide variety of fault situations. A distinction is made here among five instances of conductor interruption in the environment of the energy reservoir. Firstly, an interruption between the attachment of the supply conductor to the sensor and the energy reservoir can be detected. An interruption in the supply conductor to the sensor can also be ascertained. An interruption in the ground strap between the energy reservoir or sensor and the bodywork can furthermore be detected. It is also possible to detect detachment of the sensor from the terminal of the negative pole. Detection of an interruption in the supply conductor to the vehicle electrical system is also possible. Reliable fault detection is especially important specifically for vehicles having safety-relevant driving functions, such as those that occur with so-called "plug-in" hybrid vehicles.

If an interruption in the ground strap between the battery and bodywork occurs while the vehicle is running, for example, then according to the present invention the fault is recognized. Without the approach according to the present invention, however, upon startup of the combustion engine while driving, the high current demand of the starter motor would no longer be able to be met by the DC voltage converter. Because the energy reservoir would then also not be available as a buffer, the electrical system voltage falls well below the permissible level and the vehicle electrical system could fail. This is prevented by the present invention by the fact that attention is drawn promptly to possible fault states.

In a useful refinement, provision is made that the sensor and/or an energy management system actively trigger or bring about a change in the electrical system voltage. Those changes are then implemented, for example, by the generator or the DC/DC converter or DC voltage converter. The above-described operating states can thereby be achieved flexibly and in controlled fashion, for example at the beginning of a journey, at regular intervals, or if a fault is suspected. Alternatively, passive changes in the electrical system voltage and/or battery current could also be observed during the various vehicle electrical system states (normal operation, passive assistance, regeneration, desulfation).

Further useful refinements of the present invention are described herein.

BRIEF DESCRIPTION OF THE DRAWINGS

Exemplifying embodiments of the apparatus according to the present invention and of the method according to the present invention for detecting the connection between an energy reservoir and the vehicle electrical system, preferably of a motor vehicle, are shown in the figures and are described in further detail below.

DETAILED DESCRIPTION OF EXAMPLE EMBODIMENTS

Figure 1:
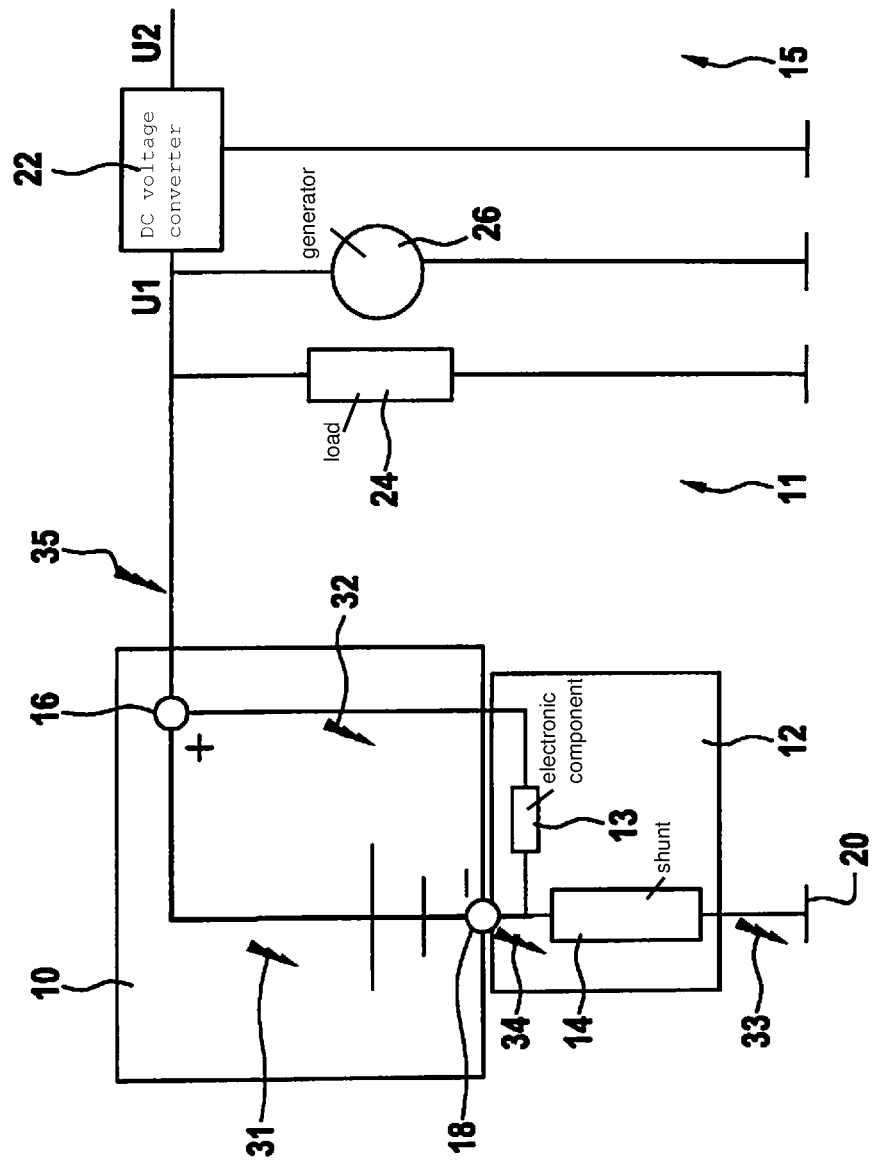
FIG. 1 is a block diagram of a simplified vehicle electrical system having a sensor, with various fault states.

In a vehicle electrical system 11 having an electrical system voltage U1, by way of example a load 24 and a generator 26 are connected to ground 20. Their positive supply potential is connected to that of an energy reservoir 10 via a node 16. The positive supply potential is tapped off at node 16 in order to supply power to a sensor 12. Another input of sensor 12 is connected via a further node 18 to the negative potential of energy reservoir 10.

A shunt 14, which is connected to ground 20 and whose other connector is contacted to node 18, is provided as part of sensor 12. This shunt 14 serves to ascertain the current Is through energy reservoir 10. Connected to node 18 is a further electronic component 13, for example an electronic evaluation system, of sensor 12, which is also contacted to node 16. Sensor 12 ascertains characteristic magnitudes of energy reservoir 10, for example the current Is flowing through energy reservoir 10 and/or the voltage Us dropping at energy reservoir 10 and/or a characteristic value for the temperature T of energy reservoir 10. From the detected magnitudes, sensor 12 ascertains further characteristic magnitudes of energy reservoir 10, for example the internal resistance Ri and/or state of charge SOC, state of health (SOH), energy reserve, or the like. The internal resistance Ri specifically is well suited as an indicator of correct operation or correct connection of energy reservoir 10. Sensor 12 is disposed for this purpose, for example, in a pole niche of a battery that constitutes a possible energy reservoir 10. Sensor 12 is embodied particularly advantageously as a battery sensor. Sensor 12 has for this purpose evaluation means, for example a microcontroller or another circuit, which correspondingly ascertain the characteristic magnitudes of energy reservoir 10 such as internal resistance Ri and/or state of charge SOC, etc. Sensor 12 furthermore encompasses communication means for exchanging input and/or output signals, for example via a bus system, with further control devices such as an energy management system 28. Also provided is a communication connection having voltage adaptation means for adapting the electrical system voltage U1, for example a DC voltage converter 22 and/or generator 26. Sensor 12 is thereby capable of acting upon the voltage adaptation means with suitable setpoints for deliberate modification of the electrical system voltage U1. The fault evaluations described below can also be effected in sensor 12 itself, in a control device for an energy management system 28, or in DC voltage converter 22.

Vehicle electrical system 11 can be coupled via a DC voltage converter 22 to a further vehicle electrical system 15 having an, in particular, higher voltage U2. DC voltage converter 22 is likewise connected to ground. DC voltage converter 22 serves as a voltage adapter and can regulate the electrical system voltage U1 to a desired level. Suitable setpoints, such as the voltage Uset and/or current Iset, can be specified to the voltage adapter for this purpose. This specification of the suitable setpoints could be accomplished by various components. In the exemplifying embodiment, sensor 12 can communicate with DC voltage converter 22 and/or with a generator 26, in which context sensor 12 can specify the desired setpoints Uset, Iset. Alternatively, this could be accomplished by energy management system 28 or by further control devices that are not depicted. Alternatively, sensor 12 could also ascertain the current Is and/or voltage Us with the aid of other measurement principles, for example evaluation of a magnetic field that generates the current Is that is to be measured, or other conventional measurement principles.

Five fault situations 31 to 35 are shown in the block diagram according to FIG. 1. In the first fault situation 31, an interruption between the (positive) node 16 and the cells of energy reservoir 10 is indicated by a lightning bolt. The second fault situation 32 is that the supply conductor to sensor 12 is interrupted, i.e., an interruption has occurred between node 16 and the input of sensor 12. Because of the interrupted supply conductor, sensor 12 is not operating. The status of energy reservoir 10 is therefore no longer known, for example, to energy management system 28. The third fault situation 33 exists in the context of an interruption between the ground-side output of sensor 12 and the connector to ground 20, i.e., an interruption in the ground strap or ground connection between sensor 12 and, in particular, the bodywork of a motor vehicle. In this fault situation sensor 12 is still in operation, since it is still being supplied with power by energy reservoir 10 (positive supply potential and ground 20). Energy reservoir 10 is disconnected from vehicle electrical system 11, however, since the ground strap is interrupted. It has not hitherto been possible to recognize a fault situation 33 of this kind using sensor 12, since sensor 12 would continue to correctly measure the voltage Us of energy reservoir 10 and the internal resistance Ri of energy reservoir 10. It is instead necessary, as described below, to utilize other evaluation methods in order to recognize a corresponding fault. A fourth fault situation 34 involves the fact that sensor 12 is no longer correctly connected to the negative pole terminal or to node 18 of energy reservoir 10. Sensor 12 is still in operation, however, since it is still being supplied with energy via DC voltage converter 22. Sensor 12 is connected to ground via the ground connection actually provided for energy reservoir 10. Energy reservoir 10 is disconnected from vehicle electrical system 11, however, for example because a pole terminal has detached from the negative pole or from node 18. This fourth fault situation 34 could in principle still be ascertained by sensor 12 via the internal resistance Ri, but that diagnosis does not function reliably in all instances. In the fifth fault situation 35, the supply conductor between vehicle electrical system 11 and node 16 for the positive potential of energy reservoir 10 is interrupted. This fault situation cannot at present be recognized by sensor 12. Procedures described below are instead possible for that purpose.

Figure 2:
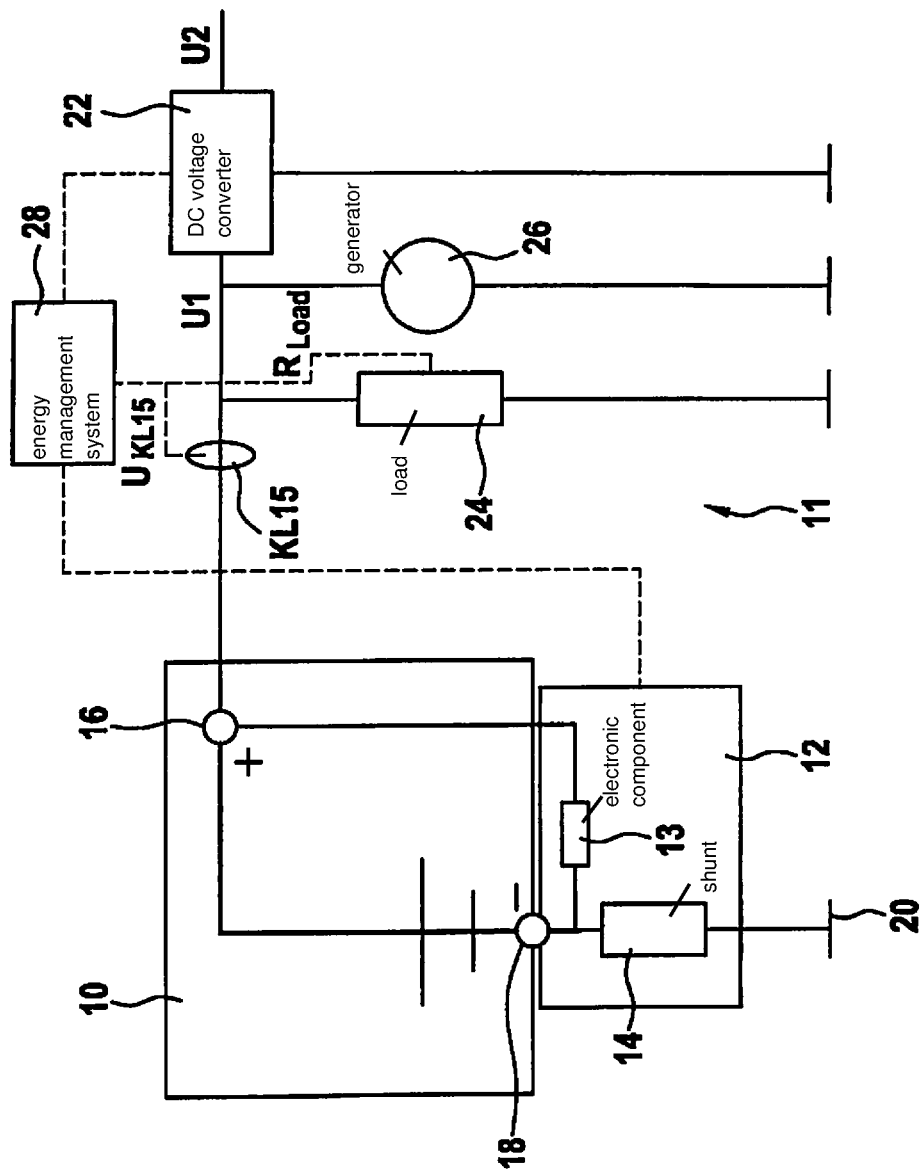
FIG. 2 shows an alternative exemplifying embodiment with an energy management system and pertinent measured magnitudes.

In the exemplifying embodiment according to FIG. 2, an energy management system 28 is additionally provided. Energy management system 28 can communicate with DC voltage converter 22 and/or with generator 26 and can, for example, specify setpoints in terms of current (Iset) and/or voltage (Uset). DC voltage converter 22 and/or generator 26 then regulates the electrical system voltage U1, in accordance with the voltage setpoint Uset, to the setpoint voltage Uset. Energy management system 28 furthermore communicates with sensor 12. Output values of sensor 12, for example the current Is measured by shunt 14 and/or the voltage Us measured by sensor 12, and/or the internal resistance Ri, can be delivered to energy management system 28. The measured current Is corresponds to the current flowing through energy reservoir 10. The voltage Us corresponds to the voltage dropping across energy reservoir 10.

Also delivered to energy management system 28, as indicated with a dashed line, is the potential UKL15 of the so-called terminal 15, as an indication of the electrical system voltage U1. Energy management system 28 could furthermore communicate with load resistor 24 in order to perform specific load management or to ascertain the corresponding power level of load 24.

The apparatus described above operates as follows. The routine that checks whether conductor interruptions are present in the region energy reservoir 10 begins as a function of specific operating states. Those operating states can be, for example, the beginning of a journey by a motor vehicle, a check at regular intervals, or a suspected fault. A suspected fault is identified, for example, by a corresponding evaluation of the internal resistance Ri, which sensor 12 determines from specific measured magnitudes Us, Is, T using a specific algorithm.

Different variants, each having two test criteria, are possible. A test is started when electrical system voltage U1 reaches, or exceeds or falls below, specific limit voltage values U0, Ug as described below. For this purpose, these operating states could be reached deliberately as a result of corresponding setpoint specifications Uset, or it is possible to wait until those operating states are reached in normal operation.

With a first diagnostic option A, either sensor 12 or energy management system 28, or further control devices, send a setting command to a voltage adapter such as DC voltage converter 22 and/or generator 26. The setpoint voltage Uset is selected in this context so that it is lower than an open-circuit voltage U0 of energy reservoir 10. If a battery, for example a lead-acid battery, is used as energy reservoir 10, the open-circuit voltage U0 is typically between 12 V and 13 V. Uset is thus to be selected to be lower than U0. As an alternative to active specification of a lowered setpoint Uset, it is also possible to wait for operating states in which the electrical system voltage U1 decreases to or below the open-circuit voltage U0; in this case the corresponding electrical system U1 would need to be compared with the open-circuit voltage U0.

A further step checks whether the electrical system voltage U1 has then in fact decreased to the setpoint Uset which is lower than the open-circuit voltage U0. If so, further test criteria are acquired.

The voltage Us at sensor 12, or the voltage UKL15 at the so-called terminal 15 (ignition on), serves as a first test criterion (diagnosis A1). The detected voltage Us or UKL15 is compared with a limit value, namely the open-circuit voltage U0. If the voltage Us or UKL15 does not decrease below the open-circuit voltage U0 of energy reservoir 10, then no interruption exists. The voltage Us or UKL15 corresponds substantially to the open-circuit voltage U0 (Us=U0). If the voltage Us or UKL15 decreases below the open-circuit voltage U0 (U<U0), specifically to the preset voltage Uset of the voltage adaptation means (DC voltage converter 22 and/or generator 26), this then indicates an incorrect operating state. All the fault situations 31 to 35 can be recognized with this type of diagnosis.

In a subsequent step, or one proceeding concurrently with the first one, a further test criterion is utilized if the electrical system voltage U1 has decreased below the open-circuit voltage U0. For this, the current Is flowing through energy reservoir 10 is detected (diagnosis A2). This current Is is ascertained by sensor 12. If the electrical system voltage U1 has been decreased below the open-circuit voltage U0, then vehicle electrical system 11 is being supplied with power from energy reservoir Is in correct or fault-free operation, i.e. Is is very much greater than zero (Is>>0). If the current Is remains approximately zero, however (Is=0), this indicates a fault situation, specifically because the current flow is interrupted. The first, third and fourth fault situations 31, 33, and 34 can be detected with this type of diagnosis (A2). The other fault situations 32, 35 cannot be ascertained in this manner.

With a second diagnostic option B, specific measured magnitudes are evaluated if the electrical system voltage U1 rises above a limit voltage value Ug. For this, the electrical system voltage U1 is modified in controlled fashion as one alternative. The voltage adaptation means (DC voltage converter 22 and/or generator 26) receive a new setpoint Uset. The setpoint Uset is selected so that it is higher than a characteristic value of energy reservoir 10. When a battery or lead-acid battery is used as energy reservoir 10, this is, for example, the gassing voltage Ug. For a lead-acid battery Uset is selected, for example, to be higher than approx. 15 to 16 V. For this, sensor 12 and/or energy management system 28 can transmit the setpoint Uset actively to the voltage influencing means (Uset>Ug). Alternatively, it would be possible to wait for operating states in which electrical system voltage U1 is in any case higher than gassing voltage Ug. This could occur, for example, in a regeneration phase in which energy is being regenerated into energy reservoir 10. Here as well, the setpoint voltage Uset is then in the range above the gassing voltage Ug, for example in the range from 15 to 16 V.

Once the electrical system voltage U1 has reached the setpoint voltage Uset>Ug, preferably two different test criteria are ascertained. As the first test criterion, the current Is flowing through energy reservoir 10 is detected with the aid of sensor (diagnosis B1). If sensor 12 is still available or is correctly connected to vehicle electrical system 11 and/or to energy reservoir 10, the current Is flowing through energy reservoir 10 can be used for diagnostic purposes. If the setpoint voltage Uset is regulated to be higher than the gassing voltage Ug, a charging current into energy reservoir 10 will become established. A current Is that is very much greater than zero (Is>>0) thus flows. This then indicates a correct operating state with none of the fault situations 31 to 35. If the current Is remains near zero, however (Is=0), then current flow is interrupted, indicating a conductor interruption. The first, third, and fourth fault situations 31, 33, 34 can be detected by diagnosing the current Is.

In the context of the second diagnostic option B, a further test criterion B2 is evaluated if the electrical system voltage U1 is higher than the gassing voltage Ug. Test criterion B2 involves the voltage Us dropping at energy reservoir 10, and is ascertained by sensor 12. If the voltage Us corresponds approximately to the setpoint voltage Uset (Us=Uset), this indicates correct operation with no fault or conductor interruptions. If the voltage Us corresponds to the open-circuit voltage U0 of energy reservoir 10, however (Us=U0), this indicates a fault. This is the fifth fault situation 35. The third and fifth fault situations 33, 35 can be detected by way of the test criterion B2.

The table below summarizes the various diagnostic options A, B and test criteria A1, A2, B1, B2 associated with them, and the fault situations 31 to 35 that in principle can be detected with them:

| Detection possible? | Detection via sensor 12 | Diagnosis A1 | Diagnosis A2 | Diagnosis B1 | Diagnosis B2 |
|---|---|---|---|---|---|
| First fault situation 31 | Yes | Yes | Yes | Yes | No |
| Second fault situation 32 | No | Yes | No | No | No |
| Third fault situation 33 | No | Yes | Yes | Yes | Yes |
| Fourth fault situation 34 | Yes | Yes | Yes | Yes | No |
| Fifth fault situation 35 | No | Yes | No | No | Yes | where

"Detection via sensor 12"=e.g. by evaluating internal resistance Ri;

"Diagnosis A1"=Decrease Uset below U0, check whether UKL15 is higher than Us;

"Diagnosis A2"=Decrease Uset below U0, check Is;

"Diagnosis B1"=Raise Uset above Ug, check Is;

"Diagnosis B2"=Raise Uset above Ug, check Us.

To begin, the electrical system voltage U1 is deliberately modified. This is accomplished by a deliberate setpoint specification Uset and/or by waiting for the corresponding desired voltage conditions in vehicle electrical system 11. Once the desired electrical system voltage U1 is reached, corresponding test criteria, in particular Us or the voltage UKL15 at terminal 15 and current Is at sensor 12, are detected and are correspondingly compared with specific limit values. As summarized in the table, the corresponding fault situations 31 to 35 can be reliably recognized by suitable evaluations. For example, the first and fourth fault situations 31, 34 can already be recognized conventionally by way of the internal resistance Ri using sensor 12. The second, third, and fifth fault situations 32, 33, and 35 can, however, also be recognized according to the present invention by way of the evaluation as described.

Energy management system 28 can be housed in a suitable control unit. Alternatively, it could also be functionally integrated into DC voltage converter 22 or into another control device, for example a so-called body computer control device for controlling corresponding comfort functions of the motor vehicle. Energy management system 28 effects, as applicable, corresponding control application to various loads 24 in order to ensure, as applicable in prioritized fashion, a reliable supply of power to particularly important loads 24 in vehicle electrical system 11. This can be accomplished, as applicable, in interaction with sensor 12, which provides energy management system 28 with information as to the electrical power that would still be possible in light of the ascertained state of charge SOC of energy reservoir 10.

In multi-voltage vehicle electrical systems 11, 15, it is usual to utilize DC voltage converters 22 or multi-phase converters that ensure energy transfer between different vehicle electrical systems 11, 15 preferably having different voltage states U1, U2. As a rule, DC voltage converter 22 represents the interface between a conventional load-related vehicle electrical system (first vehicle electrical system 11) having a first electrical system voltage U1 (usually 12 V or 14 V), and a second vehicle electrical circuit (second vehicle electrical system 15) having a second electrical system voltage U2 that is higher than the first electrical system voltage U1, for example 48 V or 60 V or, in the high-voltage range, e.g., 200 to 400 V. Second vehicle electrical system 15 could encompass, for example, an electric motor that assists or replaces the combustion engine.

The apparatus and method described above are suitable in particular for use in a motor vehicle electrical system, but the use thereof is not limited thereto.

What is claimed is:

1. A method for detecting correct connection of at least one energy reservoir to a vehicle electrical system of a motor vehicle, the method comprising:
    using a voltage converter to lower an electrical system voltage of the vehicle electrical system below an open-circuit voltage of the energy reservoir;
    in response to the electrical system voltage of the vehicle electrical system falling below the open-circuit voltage of the energy reservoir, ascertaining a magnitude of a current flowing through the energy reservoir and a magnitude of at least one of: a voltage drop across the energy reservoir, or a voltage present at a terminal of the energy reservoir;
    comparing the ascertained voltage magnitude with the open-circuit voltage;
    comparing the ascertained current magnitude with a corresponding current limit value; and
    inferring, as a function of the comparing of the ascertained voltage magnitude with the open-circuit voltage and the comparing of the ascertained current magnitude to the current limit value, at least one fault including an interruption of a conductor providing an electrical connection.

2. The method as recited in claim 1, wherein the at least one fault is inferred if at least one of: the current flowing through the energy reservoir is equal to approximately zero, or the voltage drop across the energy reservoir falls below at least one limit value.

3. The method as recited in claim 1, further comprising selecting a setpoint for modifying the electrical system voltage so that it falls below the open-circuit voltage.

4. The method as recited in claim 3, wherein the setpoint is conveyed to the voltage converter for adaptation of the electrical system voltage.

5. The method as recited in claim 4, wherein at least one of a sensor or an energy management system specifies the setpoint for the voltage converter.

6. The method as recited in claim 1, wherein at least one of the current flowing through the energy reservoir or the voltage at the energy reservoir is ascertained by at least one sensor that is connected to at least one pole of the energy reservoir.

7. The method as recited in claim 1, wherein a change in the electrical system voltage occurs only if at least one indication of at least one fault situation exists.

8. The method of claim 1, where the current and voltage magnitudes are ascertained while maintaining an intended connection of the energy reservoir to the vehicle electrical system.

9. The method of claim 1, wherein when the comparing the ascertained voltage magnitude with the open-circuit voltage indicates that the ascertained voltage magnitude has decreased below the open-circuit voltage, and the comparing the ascertained current magnitude to the current limit value indicates that the ascertained current magnitude is approximately zero, the inferring infers the at least one fault.

10. A method for detecting correct connection of at least one energy reservoir to a vehicle electrical system of a motor vehicle, the method comprising:
    raising a voltage of the electrical system to a value higher than a gassing voltage of the energy reservoir;
    ascertaining a magnitude at least of a current flowing through the energy reservoir when the electrical system voltage exceeds the gassing voltage of the energy reservoir;
    comparing the ascertained magnitude with at least one limit value; and
    inferring, as a function of the comparing, at least one fault situation when the ascertained magnitude is equal to approximately zero, the at least one fault situation being an interruption in a conductor between ground and a sensor.

11. A method for detecting correct connection of at least one energy reservoir to a vehicle electrical system of a motor vehicle, the method comprising:
    in response to an electrical system voltage of the vehicle electrical system rising higher than a gassing voltage of the energy reservoir, ascertaining a magnitude of a current flowing through the energy reservoir and a magnitude of at least one of: a voltage drop across the energy reservoir, or a voltage present at a terminal of the energy reservoir;
    comparing the ascertained voltage magnitude with the gassing voltage;
    comparing the ascertained current magnitude with a corresponding current limit value; and
    inferring, as a function of the comparing of the ascertained voltage magnitude with the gassing voltage and the comparing of the ascertained current magnitude to the current limit value, at least one fault including an interruption of a conductor providing an electrical connection.

12. The method of claim 11, wherein when the comparing the ascertained voltage magnitude with the gassing voltage indicates that the ascertained voltage magnitude has increased above the gassing voltage, and the comparing the ascertained current magnitude to the current limit value indicates that the ascertained current magnitude is approximately zero, the inferring infers the at least one fault.

13. The method as recited in claim 11, further comprising using a circuit to raise the electrical system voltage above the gassing voltage of the energy reservoir.

\* \* \* \* \*